United States Patent
Wu et al.

(10) Patent No.: US 10,854,548 B2
(45) Date of Patent: Dec. 1, 2020

(54) INTER-DIE PASSIVE INTERCONNECTS APPROACHING MONOLITHIC PERFORMANCE

(71) Applicant: Intel Corporation, Santa Clara, CA (US)

(72) Inventors: Zuoguo Wu, San Jose, CA (US); Debendra Das Sharma, Saratoga, CA (US); Adel A. Elsherbini, Chandler, AZ (US); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/236,136

(22) Filed: Dec. 28, 2018

(65) Prior Publication Data
US 2020/0211965 A1  Jul. 2, 2020

(51) Int. Cl.
| | |
|---|---|
| *H01L 23/538* | (2006.01) |
| *H01L 25/00* | (2006.01) |
| *H01L 23/00* | (2006.01) |
| *H01L 25/065* | (2006.01) |

(52) U.S. Cl.
CPC ...... *H01L 23/5381* (2013.01); *H01L 23/5384* (2013.01); *H01L 23/5385* (2013.01); *H01L 23/5386* (2013.01); *H01L 24/95* (2013.01); *H01L 25/065* (2013.01); *H01L 25/50* (2013.01)

(58) Field of Classification Search
CPC . H01L 33/62; H01L 51/5253; H01L 25/0753; H01L 43/12; C09K 11/06
USPC ........................................................ 257/774
See application file for complete search history.

(56) References Cited

U.S. PATENT DOCUMENTS

| | | | | |
|---|---|---|---|---|
| 2006/0226527 A1* | 10/2006 | Hatano | ............... | H01L 23/5389 257/686 |
| 2011/0316572 A1* | 12/2011 | Rahman | ............. | G01R 31/2853 324/754.03 |
| 2019/0206837 A1* | 7/2019 | Kurita | ................. | H01L 23/5389 |

* cited by examiner

*Primary Examiner* — Andy Huynh
(74) *Attorney, Agent, or Firm* — Schwegman Lundberg & Woessner, P.A.

(57) ABSTRACT

Inter-die passive interconnects are lengthened while locating I/O circuitry away from die edge, such that passive interconnect length is agglomerated toward the die edge, and inter-die communication is expedited.

21 Claims, 9 Drawing Sheets

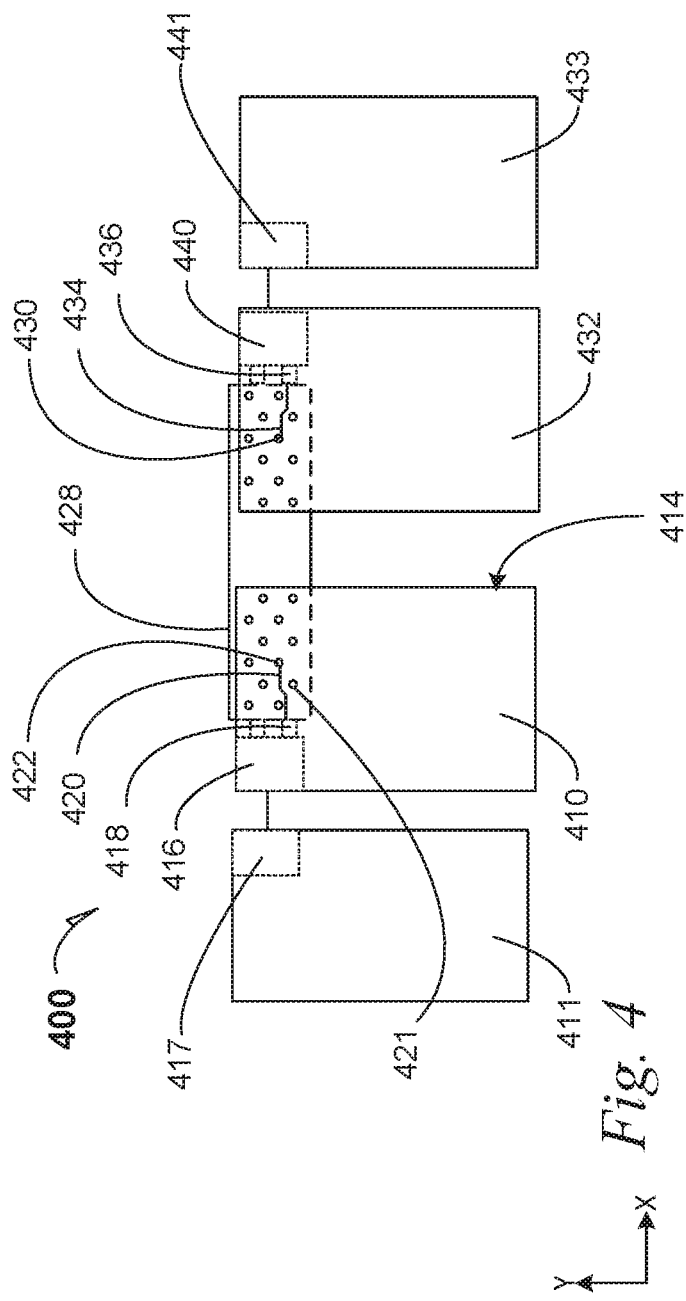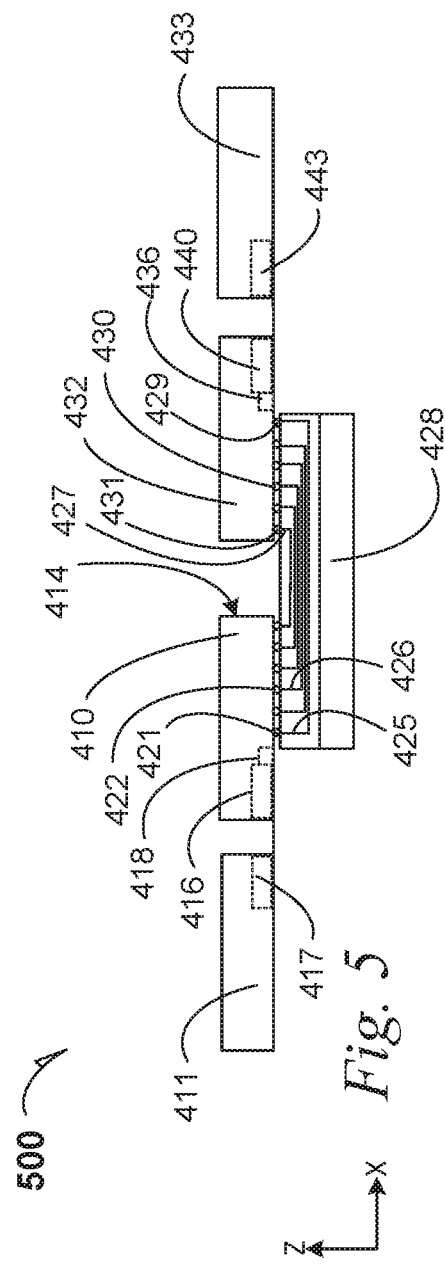

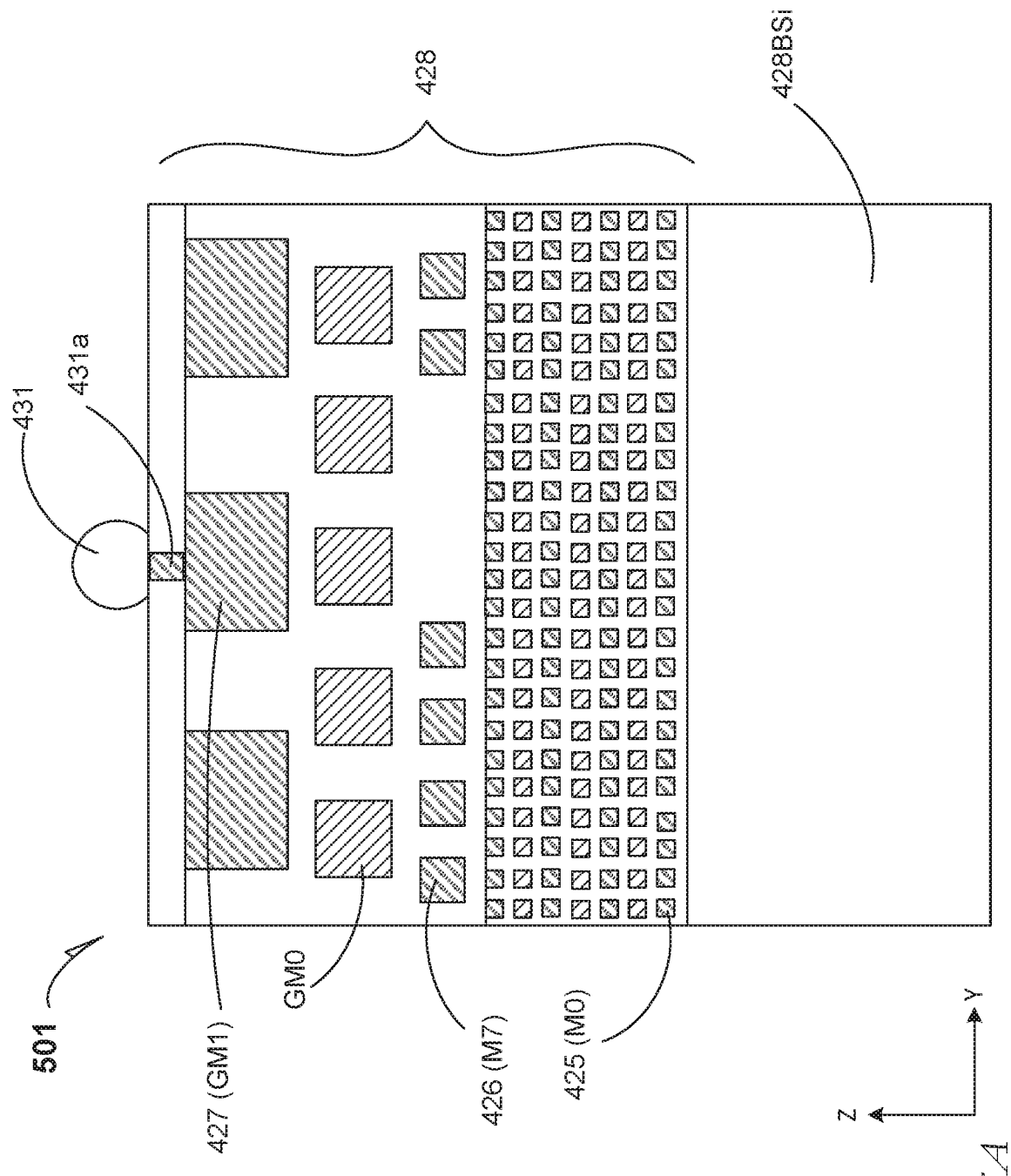

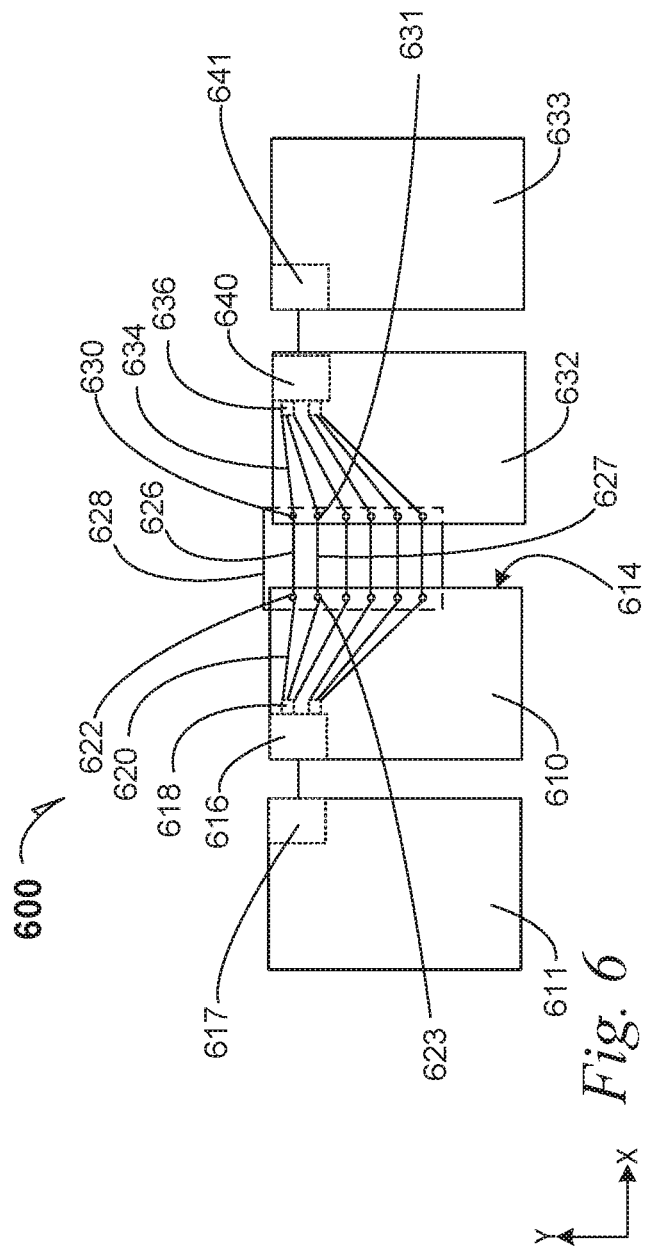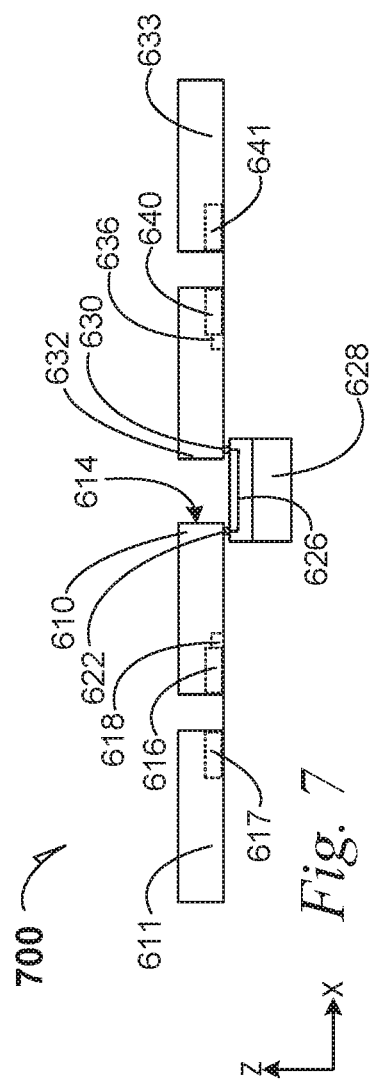

INTER-DIE PASSIVE INTERCONNECTS APPROACHING MONOLITHIC PERFORMANCE

FIELD

This disclosure relates to modular-die configurations that emulate monolithic die performance.

BACKGROUND

Semiconductive device miniaturization during packaging includes assembling closely connected components into packages.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 4 is a top plan of an inter-die interconnect for a bridge-die multi-chip package according to an embodiment;

FIG. 5 is a cross-section elevation and partial projection of structures depicted within the inter-die interconnect for a bridge-die multi-chip package illustrated in FIG. 4 according to an embodiment;

FIG. 5A is a cross-section elevation of a portion of a bridge die according to an embodiment;

FIG. 6 is a top plan of an inter-die interconnect for a bridge-die multi-chip package according to an embodiment;

FIG. 7 is a cross-section elevation and partial projection of structures depicted within the inter-die interconnect for a bridge-die multi-chip package illustrated in FIG. 6 according to an embodiment;

DETAILED DESCRIPTION

Composite on-chip and on-package passive interconnect channels are configured with short flight-time inter-chip signals in disaggregation techniques. As short flight-time inter-chip signals are decreased, monolithic die performance is emulated, while components are locally optimized in the fab. Advantages of fabricating separate dice under the constraints of miniaturization, are moderated by locating input-output (I/O) circuits closer to the core circuitry, while assembling composite passive signal channels to reach a given die edge, through a bridge die, and through passive signal channels, if any, at a second die edge, until I/O circuits are reached within the second die. In this disclosure, dice are semiconductive devices that include active regions where logic, memory and interconnect functions are operated, among others, and bridge dice are semiconductive substrates with at least interconnect metallization for coupling two semiconductive devices.

Figure 1:
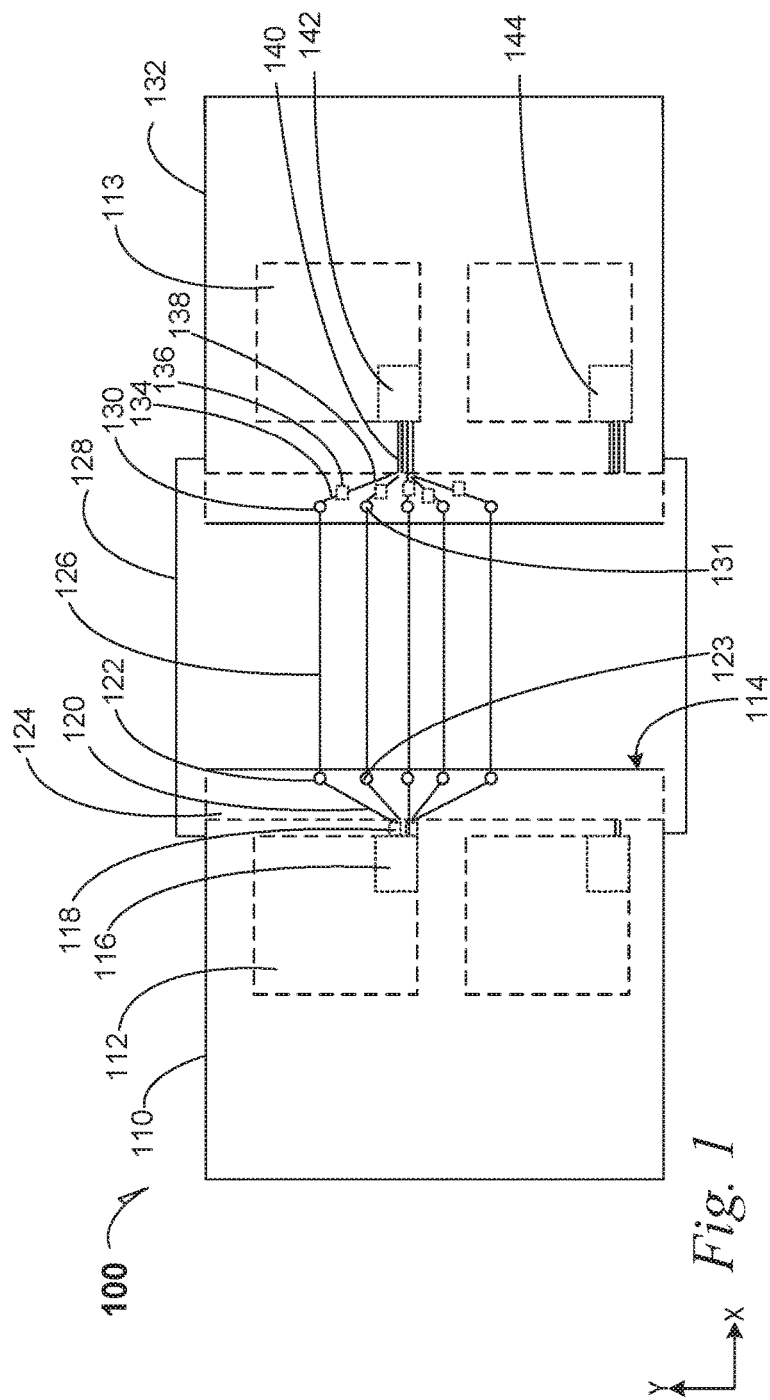
FIG. 1 is a top plan of an inter-die interconnect for a bridge-die multi-chip package according to an embodiment.

FIG. 1 is a top plan of an inter-die interconnect for a bridge-die multi-chip package 100 according to an embodiment. In an embodiment, a first die 110 and a second die 132 are contacted by a bridge die 128. Although the first die 110 and the second die 132 may have similar general functional structures and apparatus, the first die 110 has composite passive signal channels according to an embodiment. Accordingly, flight time between disaggregated dice 110 and 132, through the composite passive signal channels, allows the inter-chip signal flight-time to decrease.

The first die 110 includes signal routing from a core logic region 112 to a first-die, first edge 114. In an embodiment, a first-die, first converged mesh-stop (CMS) region 116 is adjacent or within the core logic region 112. In an embodiment, a first-die, first on-die input-output (I/O) circuitry 118 is adjacent the CMS region 116. Extending from the first-die, first on-die I/O circuitry 118 is a first-die, first on-die routing 120 that extends toward the first-die, first edge 114, until it contacts a first-die, first electrical contact 122. In an embodiment, the first-die, first on-die routing 120, passes through a modular die-fabric interconnect (MDFI) region 124, which is bordered at the first die edge 114.

In an embodiment, the first-die, first electrical contact 122 is an electrical bump such as a solder ball in a ball-grid array, that allows the first die 110 to be flip-chip coupled to the bridge die 128. The first-die, first on-die routing 120 is the beginning of a composite passive routing channel according to an embodiment. The first-die, first electrical contact 122 also contacts the bridge die 128, although a via portion that is directed in the Z-direction may be required to contact the first-die, first electrical contact 122.

The composite passive routing channel continues with a bridge-die, first passive routing 126, which contacts the first-die, first electrical contact 122. The bridge-die, first passive routing 126 is part of a metallization of the bridge die 128 and the bridge-die, first passive routing 126 contacts a second-die, first electrical contact 130 that contacts both the bridge die 128 and the second die 132. Other contacts include a first-die, second electrical contact 123 that is adjacent the first die first electrical contact 122, and a second-die, second electrical contact 131 that is adjacent the second-die, first electrical contact 130. Further, a first-die NW electrical contact (not enumerated) may be referred to as a last electrical bump, where the first-die, first electrical contact 122 is the first electrical bump on the first die 110. Similarly, a second-die N electrical contact (not enumerated) may be referred to as a last electrical bump, where the second-die, first electrical contact 130 is the first electrical bump on the second die 132.

In an embodiment, further extension of a composite passive signal channel, includes a first portion of second-die, first on-die routing 134 until the second-die, first on-die routing 134 encounters a second-die, first on-die I/O circuitry 136, at which location, the composite passive signal channel terminates. Thus, a composite passive signal channel, begins with first-die, first on-die routing 120 as it exits the first I/O circuitry 118, passes through the first-die, first electrical contact 122, the bridge-die passive routing 126 (also referred to as an EMIB/ODI 126), the second-die, first contact 130, and the second-die first on-die routing 134.

In an embodiment, further signal channeling to a second-die, first CMS region 140 of the second die 132, includes an on-die 132 post I/O routing 138 and 140 until the second-die, first CMS region 140 is reached, which in an embodiment is within a second-die, first core-logic region 113.

As illustrated, the first-die, first I/O circuitry 118 is connected to a composite passive signal channel, compared to other CMS regions 142, 144 on the second die 132, where passive channels are interrupted by, e.g., the second-die, first I/O circuitry 136.

Because the propagation delay is shorter in a passive composite interconnect channel than in an on-die distribution, useful latency is approached or even achieved by combining the passive channels. I/O circuits are moved from MDFI region 124 to inside areas of a CMS region 116, or next to the CMS region 116. In an embodiment, the passive composite interconnect channel commences upon exiting the transceiver 118 with the die routing 124, the first-die, first bump 122, the EMIB/ODI 126, second-die, first bump 130, and the second-die, first on-die routing 134, and it terminates upon entering the transceiver of the second-die, first on-die I/O circuitry 136. Because electrical signals are electromagnetic waves, the additional channel length adds minimal latency such as seven picoseconds per millimeter. Therefore, the signal latency from core to core across a bridge die, is near monolithic performance despite physical separation of the composite components of a disaggregated die.

Figure 2:
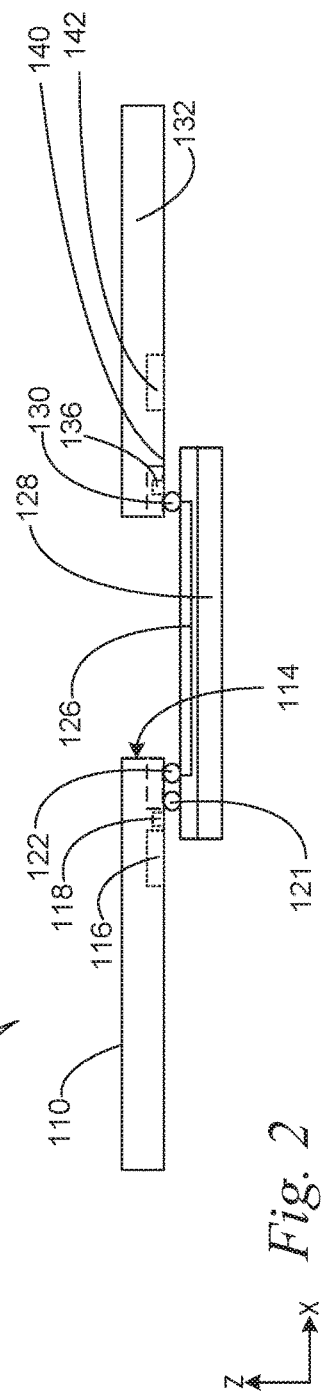
FIG. 2 is a cross-section elevation and partial projection of structures depicted within the inter-die interconnect for a bridge-die multi-chip package illustrated in FIG. 1 according to an embodiment.

FIG. 2 is a cross-section elevation and partial projection 200 of structures depicted within the inter-die interconnect for a bridge-die multi-chip package 100 illustrated in FIG. 1 according to an embodiment. The first die 110 depicts the first-die, first CMS region 116 and the adjacent first-die, first I/O circuitry 118. The first-die, first electrical contact 122 contacts the bridge die 128 at the EMIB/ODI 126 that is the first passive routing 126. A first-die, second contact 121 also emerges from the first die 110 and contacts the bridge die 128. A first die second contact 121 is not illustrated in FIG. 1, nor is passive routing within metallization from the first-die, second contact 121, as it is either in front of or behind the plane of the drawing as it passes along the bridge die 128.

As illustrated, the second-die, first I/O circuitry 136 is not adjacent the second-die, first CMS region 142, such that composite passive routing that leaves from the first-die, first I/O circuitry 118, terminates at the second-die, first I/O circuitry 136.

Figure 3:
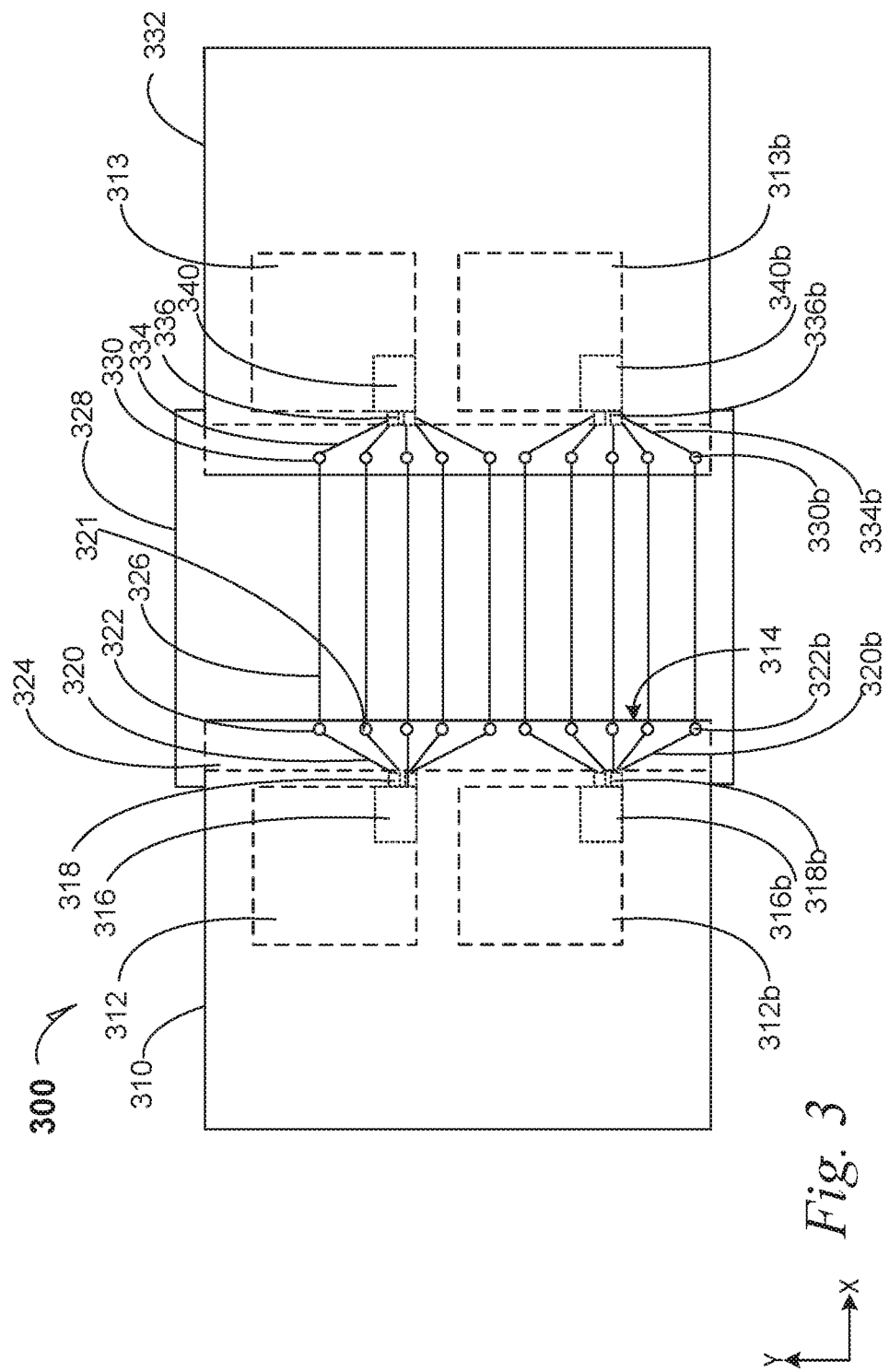
FIG. 3 is a top plan of an inter-die interconnect for a bridge-die multi-chip package according to an embodiment.

FIG. 3 is a top plan of an inter-die interconnect for a bridge-die multi-chip package 300 according to an embodiment. In this embodiment, all passive routing is interconnected without active circuitry interruption.

Like reference numerals among the several figures may refer to similar structures. For example, a first die 310 with a first-die, first core-logic region 312, may be relatable to a second die 332 with a second-die, first core-logic region 313. Similarly, a first-die, second core-logic region 312b, may be relatable to a second-die, second core-logic region 313b.

In an embodiment, a first die 310 and a second die 332 are contacted by a bridge die 328. Although the first die 310 and the second die 332 may have similar general functional structures and apparatus, the first die 310 and the second die 332 each has composite passive signal channels according to an embodiment. Accordingly, flight time through the composite passive signal channels, allows the inter-chip signal flight-time to decrease.

In an embodiment, the first die 310 and the second die 332 act as a split-die central-processing unit (CPU) where I/O physical die (PHY) circuits are designed as the last active devices before a composite passive signal channel is achieved, from e.g., the first die 310, across the bridge die 328, to the second die 332, such that between the first-die, first I/O PHY circuit 318 and the second-die, second I/O PHY circuit 336, a composite and dedicated passive I/O channel is assembled.

The first die 310 includes signal routing from a core logic region 312 to a first-die, first edge 314. A first-die, first converged mesh-stop (CMS) region 316 is adjacent or within the core logic region 312. In an embodiment, a first-die, first on-die input-output (I/O) circuitry 318 is adjacent the CMS region 316. Extending from the first-die, first on-die I/O circuitry 318 is a first-die, first on-die routing 320 that extends toward the first-die, first edge 314, until it contacts a first-die, first electrical contact 322. In an embodiment, the distance the first-die, first on-die routing 320 travels between the first-die, first I/O PHY circuit 318 and the first-die, first electrical contact 322 is in a range from 0.1 millimeter (mm) to about 1 mm, where center-to-center bump spacing between the first-die, first electrical contact 322 and an adjacent electrical contact 321 is in a range from 0.5 mm to 2.5 mm. In an embodiment, capacitance developed within the first-die, first on-die routing 320 is in a range from about 0.2 to 0.5 pico Farad (pF), and the resistivity is in a range from 25 Ohm to 75 Ohm. In an embodiment within these ranges, the distance the first-die, first on-die routing 320 travels between the first-die, first I/O PHY circuit 318 and the first-die, first electrical contact 322 is less than 0.5 mm, the capacitance developed within the first-die, first on-die routing 320 is in a range from about 0.3 to 0.4 pF, and the resistivity is about 50 Ohm.

In an embodiment, the first-die, first on-die routing 320, passes through a modular die-fabric interconnect (MDFI) region 324, which is bounded at the first die edge 314.

In an embodiment, the first-die, first electrical contact 322 is an electrical bump such as a solder ball that allows the first die 310 to be flip-chip coupled to the bridge die 328. The first-die, first on-die routing 320 is the beginning of a composite passive routing channel according to an embodiment. The first-die, first electrical contact 322 also contacts the bridge die 328.

The composite passive routing channel continues with a bridge-die, first passive routing 326, which contacts the first-die, first electrical contact 322. The bridge-die, first passive routing 326 is part of a metallization of the bridge die 328 and the bridge-die, first passive routing 326 contacts a second-die, first electrical contact 330 that contacts both the bridge die 328 and the second die 332.

In an embodiment, the distance the bridge-die, first passive routing 326 travels between the contacts 322 and 330, is bridge-die design dependent, in a range from 5 mm to 50 mm. In an embodiment, capacitance developed in the routing 326 is in a range from about 0.2 to 0.5 pF, and the resistivity is in a range from 25 Ohm to 75 Ohm. In an embodiment within these ranges, the distance the bridge-die, first passive routing 326 travels is about 15 mm, the capacitance developed is in a range from about 0.3 to 0.4 pF, and the resistivity is about 50 Ohm.

In an embodiment, further extension of a composite passive signal channel, includes a second-die, first on-die routing 334 until the second-die, first on-die routing 334 encounters a second-die, first on-die I/O circuitry 336, at which location, the composite passive signal channel terminates. Thus, a composite passive signal channel, begins with first-die, first on-die routing 320 as it exits the first I/O circuitry 318, passes through the first-die, first electrical contact 322, the bridge-die passive routing 326, the second-die, first contact 330, and the second-die, first on-die routing 334, which terminates at the second-die, first on-die I/O circuitry 336. Not illustrated are possible vertical interconnects, such as a vertical interconnect that contacts both the first-die, first on-die routing 320 and the first-die, first electrical contact. In any event, such incidental interconnects do not contact active circuitry.

In an embodiment, the second-die, first on-die I/O circuitry 336 is immediately adjacent a second-die, first CMS region 340.

Similarly in an embodiment, the first die 310 includes signal routing from a first-die, second core-logic region 312b to the first-die, first edge 314. A first-die, second converged mesh-stop (CMS) region 316b is adjacent or within the first-die, second core-logic region 312b. In an embodiment, a first-die, second on-die input-output (I/O) circuitry 318b is adjacent the first-die, second CMS region 316b. Extending from the first-die, second on-die I/O circuitry 318b is a first-die, second on-die routing 320b that extends toward the first-die, first edge 314, until it contacts a first-die, second electrical contact 322b. In an embodiment, the first-die, second on-die routing 320b, passes through the modular die-fabric interconnect (MDFI) region 324, which is bounded at the first die edge 314.

Similarly in an embodiment of a disaggregated processor semiconductor device, where four core-logic regions are configured within the first die 310 and the second die 312 with two core-logic regions each a second-die, second core-logic region 313b and similar circuitries and interconnections are provided.

FIG. 4 is a top plan of an inter-die interconnect for a bridge-die multi-chip package 400 according to an embodiment. In an embodiment, a narrow-and-deep bridge die 428 is part of a composite passive-channel interconnect between two dice of a disaggregated semiconductor device. In an embodiment, a "narrow-and-deep" bridge die 428 has passive I/O channels that form metallization strata within the bridge die 428 up to eight metallization layers that are sequentially vertically adjacent. Where useful in an embodiment, different metallization types include small, medium and giant. In an embodiment, a first die 410 and a second die 432 are contacted by a bridge die 428. Although the first die 410 and the second die 432 may have similar general functional structures and apparatus, the first die 410 has composite passive signal channels according to an embodiment. Accordingly, flight time through the composite passive signal channels, allows the inter-chip signals flight-time to decrease.

The first die 410 includes signal routing from a core logic region (not pictured) to a first-die, first edge 414. A first-die, first converged mesh-stop (CMS) region 416 is adjacent or within the core logic region. In an embodiment, a first-die, first on-die input-output (I/O) circuitry 418 is adjacent the CMS region 416. Extending from the first-die, first on-die I/O circuitry 418 is a first-die, first on-die routing 420 that extends toward the first-die, first edge 414, until it contacts a first-die, first electrical contact 422. In an embodiment, the first-die, first on-die routing 420, passes through a modular die-fabric interconnect (MDFI) region, which is bounded at the first die edge 414.

In an embodiment, the electrical contact 422 is an electrical bump such as a solder ball that allows the first die 410 to be flip-chip coupled to the bridge die 428. The first-die, first on-die routing 420 is the beginning of a composite passive routing channel according to an embodiment. The first-die, first electrical contact 422 also contacts the bridge die 428. As illustrated, the first-die, first electrical contact 422 is somewhere among an array of electrical contacts where the bridge die 428 has an elongate form factor along the X-direction and a "deep" form factor in the Z-direction (see FIG. 5).

The composite passive routing channel continues with a bridge-die, first passive routing 426 (see FIG. 5), which contacts the first-die, first electrical contact 422. The bridge-die, first passive routing 426 is part of a metallization of the bridge die 428. As illustrated, several passive routings are illustrated within the bridge die 428, among which is the bridge-die, first passive routing 426. In an embodiment, the bridge-die, first passive routing 426 contacts a second-die, first electrical contact 430 that contacts both the bridge die 428 and the second die 432.

Attention is directed again to FIG. 4. In an embodiment, further extension of a composite passive signal channel, includes a first portion of second-die, first on-die routing 434 until the second-die, first on-die routing 434 encounters a second-die, first on-die I/O circuitry 436, at which location, the composite passive signal channel terminates. Thus, a composite passive signal channel, begins with first-die, first on-die routing 420 as it exits the first I/O circuitry 418, passes through the first-die, first electrical contact 422, the bridge-die passive routing 426 as one of many routings in the bridge die 428 in a narrow and deep configuration, the second-die, first contact 430, and the second-die, first on-die routing 434.

Because the propagation delay is shorter in a passive composite interconnect channel than in an on-die distribution, useful latency is approached or even achieved by combining the passive channels in disclosed die-disaggregation techniques. I/O circuits are moved from an MDFI region to inside areas of a CMS region 416, or next to the CMS region 416. In an embodiment, the channel commences upon exiting a transceiver 418, on die routing 424, first-die, first bump 422, EmIB/ODI 426, second-die, first bump 430, second-die, first on-die routing 434, where it terminates upon entering second-die, first I/O circuitry. Because electrical signals are electromagnetic waves, the additional channel length adds minimal latency such as seven picoseconds per millimeter. Therefore, the signal latency from core to core across a bridge die, is near monolithic performance despite physical separation of composite components in a disclosed disaggregated semiconductor device technique.

FIG. 5 is a cross-section elevation and partial projection 500 of structures depicted within the inter-die interconnect for a bridge-die multi-chip package 400 illustrated in FIG. 4 according to an embodiment. The first die 410 depicts the first-die, first CMS region 416 and the adjacent first-die, first I/O circuitry 418. The first-die, first electrical contact 422 contacts the bridge die 428 at the first passive routing 426. The first passive routing 426 depicts a horizontal portion and two vertical portions, one each of which complete contact with the first-die, first electrical contact 422 and the second-die, first electrical contact 430.

A first-die, second contact 421 also contacts the first die 410 and contacts the bridge die 428. The first die second contact 421 is illustrated in FIG. 5 as passive routing within metallization from the first-die, second contact 421, and it is illustrated by way of narrow-and-deep example, below the bridge-die, first passive routing 426.

As illustrated, the second-die, first I/O circuitry 436 is adjacent the second-die, first CMS region 440, such that composite passive routing that leaves from the first-die, first I/O circuitry 418, terminates at the second-die, first I/O circuitry 436.

In an embodiment, multiple dice are assembled such as an adjacent-first die 411 that is daisy-chain connected to the first die 410, with an adjacent-first-die, first CMS region 417, that is configured to be adjacent the first-die, first CMS region 416. Accordingly, electrical communication from the adjacent-first die 411 to the second die 432, is expedited by allowing signals to connect to a composite passive communication channel that emerges from e.g., the first-die, first I/O circuitry 418. In an embodiment, an adjacent-second die 433 is daisy-chain connected to the second die 410, with an adjacent-third-die first CMS region 441, that is configured to be adjacent the second-die, first CMS region 440. Accordingly, electrical communication from the adjacent-second die 433 to the first die 410, is expedited by allowing signals to connect to a composite passive communication channel that emerges from e.g., the second-die, first I/O circuitry 436.

FIG. 5A is a cross-section elevation of a portion of a bridge die according to an embodiment. For example, the bridge die 428 depicted in FIGS. 4 and 5, includes different qualities of passive routing in the metallization according to different useful applications of composite passive routing that require different resistivities.

In an embodiment, different passive routing vias and traces are assembled into the bridge die 428, such as the bridge-die, first passive routing 426, a bridge-die subsequent passive routing 425 (also seen in FIG. 5), and a bridge-die third routing 427. In an embodiment, each of the passive routings 425, 426 and 427 have different trace qualities such as respective small, regular and giant metallization characteristics.

In an example embodiment, different cross-section sizes of the passive routings are in the bridge die 428, which includes the metallization region 428 and a bulk silicon region 428BSi. In an example embodiment, the passive routing 425 is one of an array of small traces that begin at metal-zero (M0), the passive routing 426 is one of an array of medium traces 426 such as may be an M7, and the passive routing 427 is one of an array of large or giant-metal traces 427 such as a giant-metal one (GM1).

Accordingly, the first-die, second contact 421 (see FIG. 5) contacts a bridge-die, second passive routing 425 that is in a metallization strata that is vertically displaced compared to the bridge-die, first passive routing 426. In an embodiment, a narrow-and-deep metallization includes between three and nine layers in the Z-direction as a metallization strata. Similarly, a second-die third contact 431, contacts a giant-metal routing such as GM1 427 through an incidental vertical interconnect 431a.

FIG. 6 is a top plan of an inter-die interconnect for a bridge-die multi-chip package 400 according to an embodiment. In an embodiment, a wide-and-shallow bridge die 628 is part of a composite passive-channel interconnect between two dice. In an embodiment, a first die 610 and a second die 632 are contacted by a bridge die 628. Although the first die 610 and the second die 632 may have similar general functional structures and apparatus, the first die 610 has composite passive signal channels according to an embodiment. Accordingly, flight time through the composite passive signal channels, allows the inter-chip signal flight-time to decrease.

The first die 610 includes signal routing from a core logic region (not pictured) to a first-die, first edge 614. A first-die, first converged mesh-stop (CMS) region 616 is adjacent or within the core logic region.

In an embodiment, a first-die, first on-die input-output (I/O) circuitry 618 is adjacent the CMS region 616. Extending from the first-die, first on-die I/O circuitry 618 is a first-die, first on-die routing 620 that extends toward the first-die, first edge 614, until it contacts a first-die, first electrical contact 622. In an embodiment, the first-die, first on-die routing 620, passes through a modular die-fabric interconnect (MDFI) region, which is bounded at the first die edge 614.

In an embodiment, the first-die, first electrical contact 622 is an electrical bump such as a solder ball that allows the first die 610 to be flip-chip coupled to the bridge die 628. The first-die, first on-die routing 620 is the beginning of a composite passive routing channel according to an embodiment. The first-die, first electrical contact 622 also contacts the bridge die 628. As illustrated, the first-die, first electrical contact 622 is somewhere among an array of electrical contacts where the bridge die 628 has a wide-and-shallow form factor along the respective X- and Z directions.

The composite passive routing channel continues with a bridge-die, first passive routing 626 (see also FIG. 7), which contacts the first-die, first electrical contact 622. The bridge-die, first passive routing 626 is part of a metallization of the bridge die 628. As illustrated, several passive routings are illustrated within the bridge die 628, where the bridge-die, first passive routing 626 is among other wide-and-shallow routings that are sequentially laterally adjacent. In an embodiment, the bridge-die, first passive routing 426 contacts a second-die, first electrical contact 630 that contacts both the bridge die 628 and the second die 632. Other contacts include a first-die, second electrical contact 623 that is adjacent the first die first electrical contact 622, and a second-die, second electrical contact 631 that is adjacent the second-die, first electrical contact 630.

In an embodiment, further extension of a composite passive signal channel, includes a first portion of second-die, first on-die routing 634 until the second-die, first on-die routing 634 encounters a second-die, first on-die I/O circuitry 636, at which location, the composite passive signal channel terminates. Thus, a composite passive signal channel, begins with first-die, first on-die routing 620 as it exits the first I/O circuitry 618, passes through the first-die, first electrical contact 622, the bridge-die passive routing 626, as one of many routings in the bridge die 628 in a wide-and-shallow configuration, the second-die, first contact 630, and the second-die, first on-die routing 634.

Because the propagation delay is shorter in a passive composite interconnect channel than in an on-die distribution, useful latency is approached or even achieved by combining the passive channels. I/O circuits are moved from an MDFI region to inside areas of a CMS region 616, or next to the CMS region 616.

In an embodiment, the composite passive channel commences upon exiting the transceiver 618, the on die routing 624, the first-die, first bump 622, the EmIB/ODI 626, the second-die, first bump 630, the second-die, first on die routing 634, and it terminates as it enters the and second-die, first transceiver 636. Because electrical signals are electromagnetic waves, the additional channel length adds minimal latency such as seven picoseconds per millimeter. Therefore, the signal latency from core to core across a bridge die, is near monolithic performance despite physical separation of composite components.

In an embodiment, multiple dice are assembled such as an adjacent-first die 611 that is daisy-chain connected to the first die 610, with an adjacent-first-die, first CMS region 617, that is configured to be adjacent the first-die, first CMS region 616. Accordingly, electrical communication from the adjacent-first die 611 to the second die 632, is expedited by allowing signals to connect to a composite passive communication channel that emerges from e.g., the first-die, first I/O circuitry 618. In an embodiment, an adjacent-second die 633 is daisy-chain connected to the second die 610, with an adjacent-second-die, first CMS region 641, that is configured to be adjacent the second-die, first CMS region 640. Accordingly, electrical communication from the adjacent-second die 633 to the first die 610, is expedited by allowing signals to connect to a composite passive communication channel that emerges from e.g., the second-die, first I/O circuitry 636.

FIG. 7 is a cross-section elevation and partial projection 700 of structures depicted within the inter-die interconnect for a bridge-die multi-chip package 600 illustrated in FIG. 6 according to an embodiment. The first die 610 depicts the first-die, first CMS region 616 and the first-die, first I/O circuitry 618. The first-die, first electrical contact 622 contacts the bridge die 628 at the first passive routing 626. A first-die, second electrical contact 623 (see FIG. 6) also emerges from the first die 610 and contacts the bridge die 628. The first-die, second electrical contact 623 is illustrated in FIG. 6 as passive routing within metallization from the first-die, second contact 623, and it is illustrated by way of wide-and-shallow example, among other routing that includes the bridge-die, first passive routing 626. Accordingly, the first-die, second contact 623 contacts a bridge-die, second passive routing 627 that is in a metallization strata that is laterally adjacent to the bridge-die, first passive routing 626. In an embodiment, a wide-and-shallow metallization includes two layers in the Z-direction as a minimal two-layer metallization strata.

Figure 8:
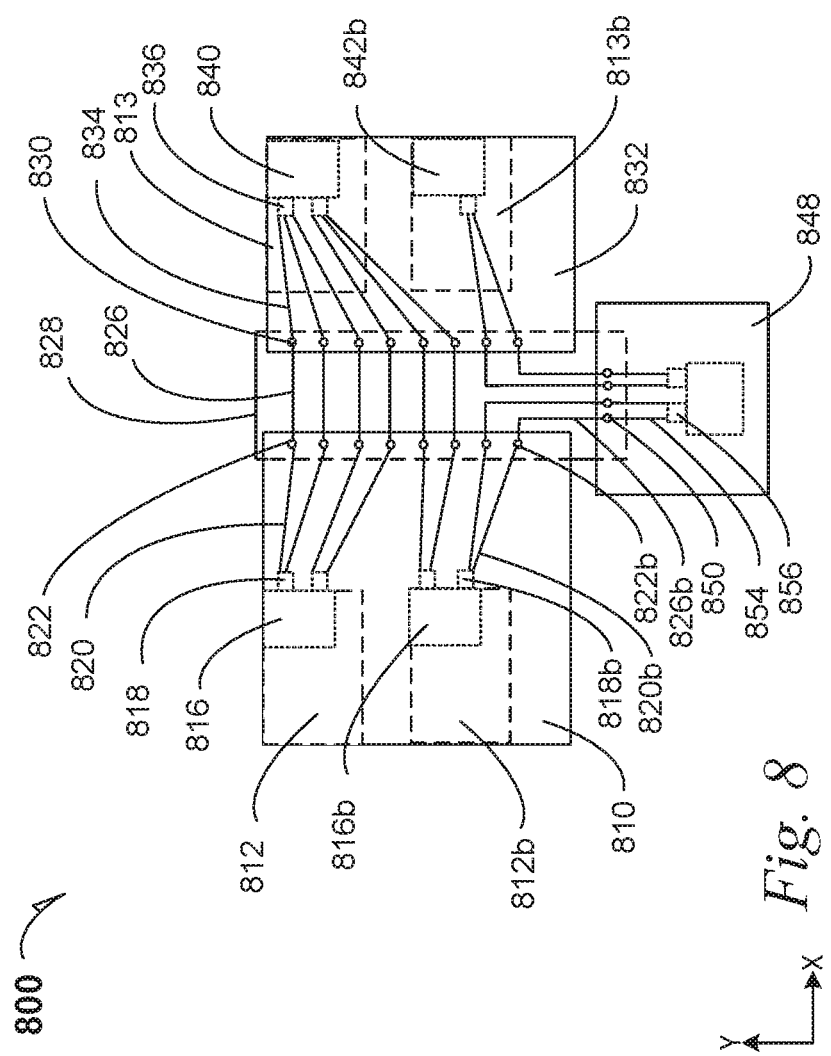
FIG. 8 is a top plan of an inter-die interconnect for a bridge-die multi-chip package according to an embodiment.

FIG. 8 is a top plan of an inter-die interconnect for a bridge-die multi-chip package 800 according to an embodiment. In an embodiment, a chipset layout uses three dimensions of a given chip package, where at least two semiconductive devices are coupled through composite passive interconnect channels.

In an embodiment, a first die 810, a second die 832 and a third die 848 are contacted by a bridge die 828. Although the first die 810, the second die 832 and the third die 848 may have similar general functional structures and apparatus, each of the first die 810, the second die 832 and the third die 848 has composite passive signal channels according to an embodiment. Accordingly, flight time through the composite passive signal channels, allows the inter-chip signal flight-time to decrease.

The first die 810 includes signal routing from a core logic region 812 to a first-die, first edge 814. A first-die, first converged mesh-stop (CMS) region 816 is adjacent or within the core logic region 812. In an embodiment, a first-die, first on-die input-output (I/O) circuitry 818 is adjacent the CMS region 816. Extending from the first-die, first on-die I/O circuitry 818 is a first-die, first on-die routing 820 that extends toward the first-die, first edge 814, until it contacts a first-die, first electrical contact 822. In an embodiment, the first-die, first on-die routing 820, passes through a modular die-fabric interconnect (MDFI) region, which is bounded at the first-die, first edge 814. The first-die, first electrical contact 822 also contacts the bridge die 828.

In an embodiment, the first-die, first electrical contact 822 is an electrical bump such as a solder ball that allows the first die 810 to be flip-chip coupled to the bridge die 828. The first-die, first on-die routing 820 is the beginning of a composite passive routing channel according to an embodiment.

The composite passive routing channel continues with a bridge-die, first passive routing 826, which contacts the first-die, first electrical contact 822. The bridge-die, first passive routing 826 is part of a metallization of the bridge die 828 and the bridge-die, first passive routing 826 contacts a second-die first electrical contact 830 that contacts both the bridge die 828 and the second die 832.

In an embodiment, further extension of a composite passive signal channel, includes a second-die, first on-die routing 834 until the second-die, first on-die routing 834 encounters a second-die, first on-die I/O circuitry 836, at which location, the composite passive signal channel terminates. Thus, a composite passive signal channel, begins with first-die, first on-die routing 820 as it exits the first I/O circuitry 818, passes through the first-die, first electrical contact 822, the bridge-die passive routing 826, the second-die, first contact 830, and the second-die, first on-die routing 834, which terminates at the second-die, first on-die I/O circuitry 836. In an embodiment, the second-die, first on-die I/O circuitry 836 is immediately adjacent a second-die, first CMS region 840.

Similarly in an embodiment, the first die 810 includes signal routing from a first-die, second core logic region 812*b* to the first-die, first edge 814. A first-die, second converged mesh-stop (CMS) region 816*b* is adjacent or within the first-die, second core logic region 812*b*. In an embodiment, a first-die, second on-die input-output (I/O) circuitry 818*b* is adjacent the first-die, second CMS region 816*b*. Extending from the first-die, second on-die I/O circuitry 818*b* is a first-die, second on-die routing 820*b* that extends toward the first-die, first edge 814, until it contacts a first-die, second electrical contact 822*b*. In an embodiment, the first-die, second on-die routing 820*b*, passes through the modular die-fabric interconnect (MDFI) region.

A composite passive routing channel continues with a bridge-die, second passive routing 826*b*, which contacts the first-die, second electrical contact 822*b*. The bridge-die, second passive routing 826*b* makes an orthogonal overall direction change toward the third die 848. The bridge-die, second passive routing 826*b* is part of the metallization of the bridge die 828 and the bridge-die, second passive routing 826*b* contacts a third-die first electrical contact 850 that contacts both the bridge die 828 and the third die 848. In an embodiment, further extension of a composite passive signal channel, includes a third-die first on-die routing 854 until the third-die first on-die routing 854 encounters a third-die first on-die I/O circuitry 856, at which location, the composite passive signal channel terminates.

By comparison in FIG. 1 with several passive-inter-die interconnects in a multi-chip assembly embodiment, a single composite inter-die interconnect such as the first-die, first on-die routing 120, the first-die, first electrical contact 122, the bridge-die, first passive routing 126, the second-die, first electrical contact 130 and the first portion of second-die, first on-die routing 134, are combined as the only composite passive interconnect. In FIG. 3 by comparison, a four core-logic region multi-chip assembly 300 has substantially symmetrical composite passive routings across the bridge die 328, between the first die 310 and the second die 332. Similarly in an embodiment in FIG. 4, a multi-chip assembly 400 has substantially symmetrical narrow-and-deep passive routings across the bridge die 428. Similarly in an embodiment in FIG. 6, a multi-chip assembly 600 has substantially symmetrical wide-and-shallow passive routings across the bridge die 628. In FIG. 8 by comparison, asymmetrical passive routings across the bridge die 828 achieve composite passive interconnects between three non-similar dice 810, 832 and 848, but composite passive channels are achieved between all I/O PHY circuits.

Figure 9:
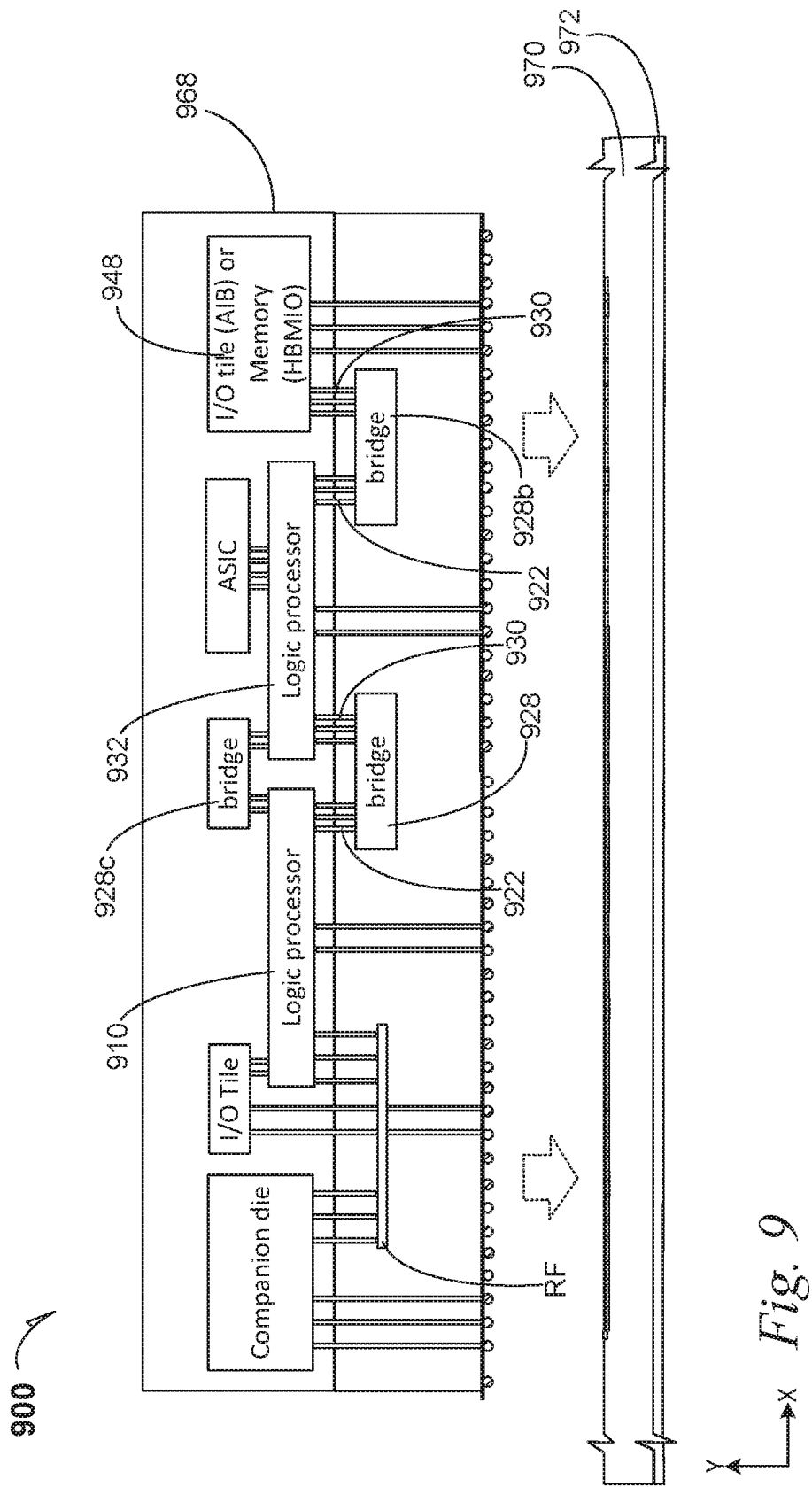
FIG. 9 is a side elevation of a semiconductor device package that includes composite inter-die passive interconnects according to an embodiment.

FIG. 9 is a side elevation of a semiconductor device package 900 that includes composite inter-die passive interconnects according to an embodiment. Structures and devices are depicted schematically, and images are not necessarily in cross section. A first die 910 and a second die 932 are connected by a first bridge die 928. In an embodiment, composite passive interconnects are assembled between, e.g., a transceiver in the first die 910, to a first on-die routing (not illustrated), to a first on-die interconnect 922 that also contacts the bridge die 928, to passive routing (not illustrated) on the bridge die 928, to a second on-die interconnect 930 that contacts the second die 932, to second-die on-die passive routing (not illustrated) and terminating at a second-die, first I/O circuitry.

In an embodiment, composite passive routing is implemented between any bridge die 928, 928*b* and 928*c* interconnect and terminating at a transceiver in the second die 932.

As illustrated in an embodiment, two bridge dice 928 and 928*c* are respectively positioned below and above, e.g. logic processors 910 and 932 within a package substrate 968, such that one bridge die couples to metallizations on a die active side, and the other bridge die couples through through-silicon vias on a die back side. Other semiconductive devices in the package substrate 968 include an application-specific integrated circuit (ASIC) such as a graphics processor and a companion die such as a baseband processor. Other functionalities in the package substrate 968 include a wireless (RF) transceiver that is coupled to a I/O processor.

In an embodiment, the semiconductor device package 900 includes a board 970 such as a printed wiring board 970. In an embodiment, the board 970 supports the package substrate 968 as part of a computing system. In an embodiment, the board 970 includes an external shell 972 that is an integral part of the board 970 and the shell 972 provides at least one of a physical and dielectric protection for the package substrate 968. For example, the shell 972 is part of a mobile computing platform such as a tablet.

Figure 10:
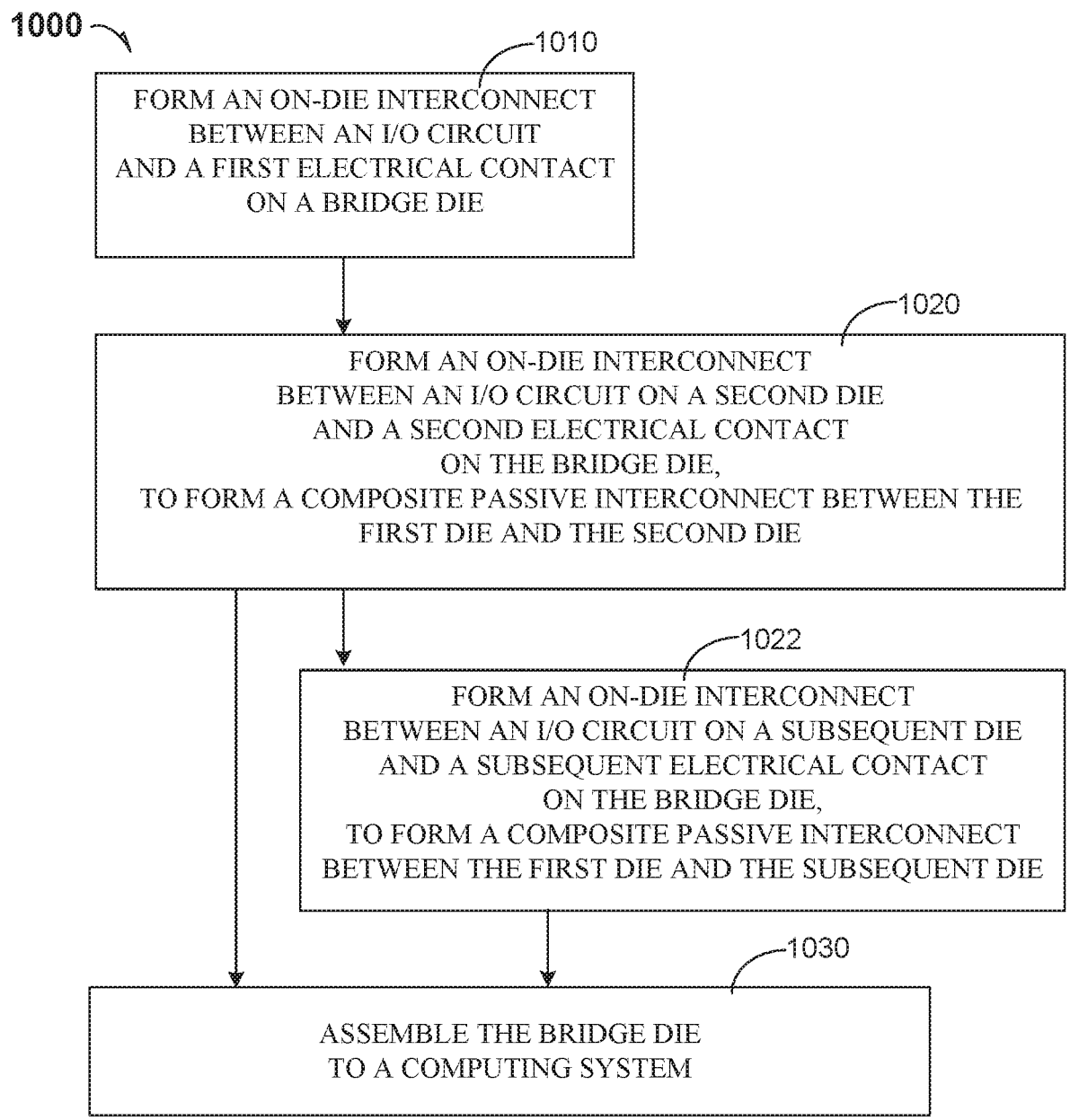
FIG. 10 is a process flow diagram for assembling a composite passive channel according to several embodiments.

FIG. 10 is a process flow diagram for assembling a composite passive channel according to several embodiment.

At 1010, the process includes forming an on-die interconnect between an I/O circuit and an electrical contact on a bridge die.

At 1020, the process includes forming an on-die interconnect between an I/O circuit on a second die and a second electrical contact on the bridge die.

At 1022, the process includes forming an on-die interconnect between an I/O circuit on a subsequent die and a subsequent electrical contact on the bridge die. In a non-limiting example embodiment, the third die 848 is the subsequent die.

At 1030, the process includes assembling the bridge die to a computing system.

Figure 11:
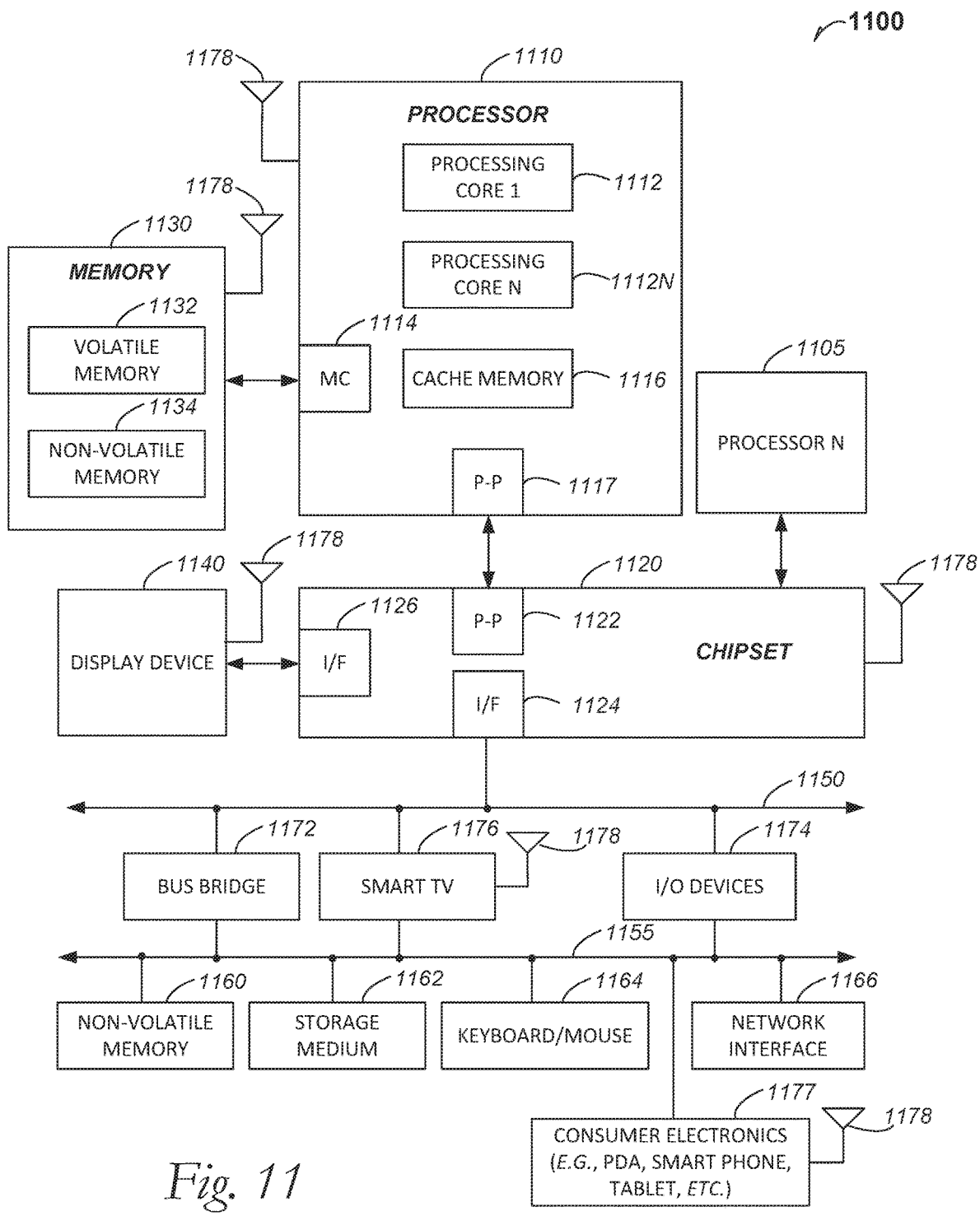
FIG. 11 is included to show an example of a higher-level device application for the disclosed embodiments.

FIG. 11 is included to show an example of a higher-level device application for the disclosed embodiments. The composite passive on-die and on-bridge die interconnect containing embodiments may be found in several parts of a computing system. In an embodiment, the composite passive on-die and on-bridge die interconnect embodiments can be part of a communications apparatus such as is affixed to a cellular communications tower. In an embodiment, a computing system 1100 includes, but is not limited to, a desktop computer. In an embodiment, a system 1100 includes, but is not limited to a laptop computer. In an embodiment, a system 1100 includes, but is not limited to a tablet. In an embodiment, a system 1100 includes, but is not limited to a notebook computer. In an embodiment, a system 1100 includes, but is not limited to a personal digital assistant (PDA). In an embodiment, a system 1100 includes, but is not limited to a server. In an embodiment, a system 1100 includes, but is not limited to a workstation. In an embodiment, a system 1100 includes, but is not limited to a cellular telephone. In an embodiment, a system 1100 includes, but is not limited to a mobile computing device. In an embodiment, a system 1100 includes, but is not limited to a smart phone. In an embodiment, a system 1100 includes, but is not limited to an internet appliance. Other types of computing devices may be configured with the microelectronic device that includes composite passive on-die and on-bridge die interconnect embodiments.

In an embodiment, the processor 1110 has one or more processing cores 1112 and 1112N, where 1112N represents the Nth processor core inside processor 1110 where N is a positive integer. In an embodiment, the electronic device system 1100 using a EMIB-backside trace containing embodiment that includes multiple processors including 1110 and 1105, where the processor 1105 has logic similar or identical to the logic of the processor 1110. In an embodiment, the processing core 1112 includes, but is not limited to, pre-fetch logic to fetch instructions, decode logic to decode the instructions, execution logic to execute instructions and the like. In an embodiment, the processor 1110 has a cache memory 1116 to cache at least one of instructions and data for the multi-layer solder resist on a semiconductor package substrate in the system 1100. The cache memory 1116 may be organized into a hierarchal structure including one or more levels of cache memory.

In an embodiment, the processor 1110 includes a memory controller 1114, which is operable to perform functions that enable the processor 1110 to access and communicate with memory 1130 that includes at least one of a volatile memory 1132 and a non-volatile memory 1134. In an embodiment, the processor 1110 is coupled with memory 1130 and chipset 1120. In an embodiment, the chipset 1120 is part of a multiple-die package such as illustrate in any of FIG. 1, 3, 4, 6, 8 or 9. The processor 1110 may also be coupled to a wireless antenna 1178 to communicate with any device configured to at least one of transmit and receive wireless signals. In an embodiment, the wireless antenna interface 1178 operates in accordance with, but is not limited to, the IEEE 802.11 standard and its related family. Home Plug AV (HPAV), Ultra Wide Band (UWB), Bluetooth, WiMax, or any form of wireless communication protocol.

In an embodiment, the volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1134 includes, but is not limited to, flash memory, phase change memory (PCM), read-only memory (ROM), electrically erasable programmable read-only memory (EEPROM), or any other type of non-volatile memory device.

The memory 1130 stores information and instructions to be executed by the processor 1110. In an embodiment, the memory 1130 may also store temporary variables or other intermediate information while the processor 1110 is executing instructions. In the illustrated embodiment, the chipset 1120 connects with processor 1110 via Point-to-Point (PtP or P-P) interfaces 1117 and 1122. Either of these PtP embodiments may be achieved using a composite passive on-die and on-bridge die interconnect embodiment as set forth in this disclosure. The chipset 1120 enables the processor 1110 to connect to other elements in a composite passive on-die and on-bridge die interconnect embodiment in a system 1100. In an embodiment, interfaces 1117 and 1122 operate in accordance with a PtP communication protocol such as the Intel® QuickPath Interconnect (QPI) or the like. In other embodiments, a different interconnect may be used.

In an embodiment, the chipset 1120 is operable to communicate with the processor 1110, 1105N, the display device 1140, and other devices 1172, 1176, 1174, 1160, 1162, 1164, 1166, 1177, etc. The chipset 1120 may also be coupled to a wireless antenna 1178 to communicate with any device configured to at least do one of transmit and receive wireless signals.

The chipset 1120 connects to the display device 1140 via the interface 1126. The display 1140 may be, for example, a liquid crystal display (LCD), a plasma display, cathode ray tube (CRT) display, or any other form of visual display device. In an embodiment, the processor 1110 and the chipset 1120 are merged into a composite passive on-die and on-bridge die interconnect embodiment in a system. Additionally, the chipset 1120 connects to one or more buses 1150 and 1155 that interconnect various elements 1174, 1160, 1162, 1164, and 1166. Buses 1150 and 1155 may be interconnected together via a bus bridge 1172 such as at least one EMIB-backside trace containing embodiment. In an embodiment, the chipset 1120, via interface 1124, couples with a non-volatile memory 1160, a mass storage device(s) 1162, a keyboard/mouse 1164, a network interface 1166, smart TV 1176, and the consumer electronics 1177, etc.

In an embodiment, the mass storage device 1162 includes, but is not limited to, a solid state drive, a hard disk drive, a universal serial bus flash memory drive, or any other form of computer data storage medium. In one embodiment, the network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth. WiMax. or any form of wireless communication protocol.

While the modules shown in FIG. 11 are depicted as separate blocks within the EMIB-backside trace containing embodiments in a computing system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into the processor core 1112.

To illustrate the composite passive on-die and on-bridge die interconnect embodiments and methods disclosed herein, a non-limiting list of examples is provided herein:

Example 1 is a multi-chip package comprising: a first semiconductive device including a first-die, first input-output circuitry; a first-die, first on-die routing in contact with the first-die, first input-output circuitry and in contact with a first-die, first electrical contact; a bridge die in contact with the first-die, first electrical contact; a bridge-die, first passive routing in contact with the first-die, first electrical contact; and a second semiconductive device in contact with a second-die, first electrical contact that is on the bridge die and in contact with the bridge-die, first passive routing.

In Example 2, the subject matter of Example 1 optionally includes a first-die, second input-output circuitry on the first die; a first-die, second on-die routing in contact with the first-die, second input-output circuitry and in contact with a first-die, second electrical contact; a bridge-die, second passive routing on the bridge die that is in contact with the first-die, second electrical contact; and wherein the bridge-die, second passive routing is coupled to the second die at a second-die, second electrical contact.

In Example 3, the subject matter of any one or more of Examples 1-2 optionally include a first-die, second input-output circuitry on the first die; a first-die, second on-die routing in contact with the first-die, second input-output circuitry and in contact with a first-die, second electrical contact; a bridge-die, second passive routing on the bridge die that is in contact with the first-die, second electrical contact; wherein the bridge-die, second passive routing is coupled to the second die at a second-die, second electrical contact; and a second-die, second on-die routing coupled in a composite passive channel to the second-die, second passive routing.

In Example 4, the subject matter of any one or more of Examples 1-3 optionally include a first-die, second input-output circuitry on the first die; a first-die, second on-die routing in contact with the first-die, second input-output circuitry and in contact with a first-die, second electrical contact; a bridge-die, second passive routing on the bridge die that is in contact with the first-die, second electrical contact; wherein the bridge-die, second passive routing is coupled to the second die at a second-die, second electrical contact; a second-die, second on-die routing coupled in a composite passive channel to the second-die, second passive routing; and wherein the second-die, second on-die routing contacts a second-die, second input-output circuitry.

In Example 5, the subject matter of any one or more of Examples 1-4 optionally include wherein the first die includes a first core-logic region and a second core-logic region, further including: a first-die, second on-die routing in contact with a first-die, second input-output circuitry that is part of the second core-logic region; a first-die, second on-die routing in contact with the first-die, second input-output circuitry and in contact with a first-die, second electrical contact, wherein the bridge die is in contact with the first-die, second electrical contact; a bridge-die, second passive routing in contact with the first-die, second electrical contact; a second-die, second electrical contact that is on the bridge die and in contact with the bridge-die, second passive routing; a second-die, second on-die routing in contact with the second-die, second electrical contact; and a second-die, second input-output circuitry in contact with the second-die, second on-die routing.

In Example 6, the subject matter of any one or more of Examples 1-5 optionally include wherein the second die includes a first core-logic region and a second core-logic region, further including: a first-die, second on-die routing in contact with a first-die, second input-output circuitry; a first-die, second on-die routing in contact with the first-die, second input-output circuitry and in contact with a first-die, second electrical contact, wherein the bridge die is in contact with the first-die, second electrical contact; a bridge-die, second passive routing in contact with the first-die, second electrical contact; a second-die, second electrical contact that is on the bridge die and in contact with the bridge-die, second passive routing; a second-die, second on-die routing in contact with the second-die, second electrical contact; and a second-die second input-output circuitry in contact with the second-die, second on-die routing, and wherein the second-die, second input-output circuitry is part of the second core-logic region.

In Example 7, the subject matter of any one or more of Examples 1-6 optionally include a third die coupled to the bridge die by a passive signal channel, wherein the third die contacts a first-die third contact on the first die.

In Example 8, the subject matter of any one or more of Examples 1-7 optionally include a first-die, second on-die routing that contacts a first-die, second electrical contact; a bridge-die, second passive routing on the bridge die that is in contact with the first-die, second electrical contact; and wherein the bridge-die, second passive routing is coupled to the second die at a bridge-die contact.

In Example 9, the subject matter of any one or more of Examples 1-8 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; and wherein the bridge-die, second passive routing is in a metallization strata vertically adjacent the bridge-die, first passive routing.

In Example 10, the subject matter of any one or more of Examples 1-9 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; and wherein the bridge-die, second passive routing is in a metallization strata vertically adjacent the bridge-die, first passive routing, and wherein the metallization strata includes at least two different cross-section sizes, including a first small size and a second medium size.

In Example 11, the subject matter of any one or more of Examples 1-10 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; and wherein the bridge-die, second passive routing is in a metallization strata vertically adjacent the bridge-die, first passive routing, and wherein the metallization strata includes at least two different cross-section sizes, including a first small size, a second medium size, and a third giant size.

In Example 12, the subject matter of any one or more of Examples 1-11 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata vertically adjacent the bridge-die, first passive routing; and an adjacent first die adjacent the first die, wherein a converged mesh-stop region in the adjacent first die is coupled to the first-die, first on-die routing.

In Example 13, the subject matter of any one or more of Examples 1-12 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata vertically adjacent the bridge-die, first passive routing; an adjacent first die adjacent the first die, wherein a converged mesh-stop region in the adjacent first die is coupled to the first-die, first on-die routing; and an adjacent second die adjacent the second die, wherein a converged mesh-stop region in the adjacent second die is coupled to the second-die, first on-die routing.

In Example 14, the subject matter of any one or more of Examples 1-13 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata vertically adjacent the bridge-die, first passive routing; and an adjacent second die adjacent the second die, wherein a converged mesh-stop region in the adjacent second die is coupled to the second-die, first on-die routing.

In Example 15, the subject matter of any one or more of Examples 1-14 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; and wherein the bridge-die, second passive routing is in a metallization strata and laterally adjacent the bridge-die, first passive routing.

In Example 16, the subject matter of any one or more of Examples 1-15 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata and laterally adjacent the bridge-die, first passive routing; and an adjacent first die adjacent the first die, wherein a converged mesh-stop region in the adjacent first die is coupled to the first-die, first on-die routing.

In Example 17, the subject matter of any one or more of Examples 1-16 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata and laterally adjacent the bridge-die, first passive routing; and an adjacent second die adjacent the second die, wherein a converged mesh-stop region in the adjacent second die is coupled to the second-die, first on-die routing.

In Example 18, the subject matter of any one or more of Examples 1-17 optionally include a first-die, second on-die routing that contacts a first-die, second electrical contact; a bridge-die, second passive routing on the bridge die that is in contact with the first-die, second electrical contact; wherein the bridge-die, second passive routing is coupled to the second die at a second-die contact; wherein the bridge-die, second passive routing is in a metallization strata and laterally adjacent the bridge-die, first passive routing; an adjacent first die adjacent the first die, wherein a converged mesh-stop region in the adjacent first die is coupled to the first-die, first on-die routing; and an adjacent second die adjacent the second die, wherein a converged mesh-stop region in the adjacent second die is coupled to the second-die, first on-die routing.

Example 19 is a multi-chip package comprising: a first die with signal routing, including: a converged mesh-stop region adjacent a core logic region; first on-die input-output (I/O) circuitry adjacent the CMS region and spaced apart from a modular die-fabric interconnect (MDFI); first-die, first on-die passive routing between the first on-die I/O circuitry and a first electrical contact that contacts a bride die, wherein the first electrical contact is closest to a first edge of the bridge die; bridge-die passive routing on the bridge die between the first electrical contact and a second electrical contact on the bridge die, wherein the second electrical contact is closest to a second edge of the bridge die; and a second die that contacts the second electrical contact.

In Example 20, the subject matter of Example 19 optionally includes wherein the second die includes a second-die, first on-die passive routing between the second electrical contact and a second-die, first on-die I/O circuitry.

In Example 21, the subject matter of any one or more of Examples 19-20 optionally include wherein the second die includes a second-die, first on-die passive routing between the second electrical contact and a second-die, first on-die I/O circuitry, further including: a third die contacting the bridge die, wherein the third die is coupled to the first die by a composite passive signal channel.

In Example 22, the subject matter of any one or more of Examples 19-21 optionally include wherein the second die includes a second-die, first on-die passive routing between the second electrical contact and a second-die, first on-die I/O circuitry, further including: a first adjacent die adjacent the first die, wherein the first adjacent die includes a passive signal channel that contacts the first die; and a second adjacent die adjacent the second die, wherein the second adjacent die includes a passive signal channel that contacts the second die.

Example 23 is a method of assembling a composite passive-channel multi-die package, comprising: forming an on-die interconnect on a first die, between and input-output circuit and a first electrical contact that contacts a bridge die; forming an on-die interconnect between an input-output circuit on a second die and a second electrical contact that contacts the bridge die; and wherein the first electrical contact and the second electrical contact are spanned by a bridge-die, first passive routing.

In Example 24, the subject matter of Example 23 optionally includes assembling an adjacent first die adjacent the first die, wherein the adjacent first die is coupled to the first die by a composite passive routing.

In Example 25, the subject matter of any one or more of Examples 23-24 optionally include assembling an adjacent second die adjacent the second die, wherein the adjacent second die is coupled to the second die by a composite passive routing.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B" unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A multi-chip package comprising:
   a first semiconductive device including a first-die, first input-output circuitry;
   a first-die, first on-die routing in contact with the first-die, first input-output circuitry and in contact with a first-die, first electrical contact;
   a bridge die in contact with the first-die, first electrical contact;
   a bridge-die, first passive routing in contact with the first-die, first electrical contact;
   a second semiconductive device in contact with a second-die, first electrical contact that is on the bridge die and in contact with the bridge-die, first passive routing;
   a first-die, second on-die routing that contacts a first-die, second electrical contact;
   a bridge-die, second passive routing on the bridge die that is in contact with the first-die, second electrical contact;
   wherein the bridge-die, second passive routing is coupled to the second die at a second-die contact; and
   wherein the bridge-die, second passive routing is in a metallization strata vertically adjacent the bridge-die, first passive routing.

2. The multi-chip package of claim 1, further including:
   a first-die, second input-output circuitry on the first die;
   a first-die, second on-die routing in contact with the first-die, second input-output circuitry and in contact with a first-die, second electrical contact;
   a bridge-die, second passive routing on the bridge die that is in contact with the first-die, second electrical contact; and
   wherein the bridge-die, second passive routing is coupled to the second die at a second-die, second electrical contact.

3. The multi-chip package of claim 1, further including:
   a first-die, second input-output circuitry on the first die;
   a first-die, second on-die routing in contact with the first-die, second input-output circuitry and in contact with a first-die, second electrical contact;
   a bridge-die, second passive routing on the bridge die that is in contact with the first-die, second electrical contact;
   wherein the bridge-die, second passive routing is coupled to the second die at a second-die, second electrical contact; and
   a second-die, second on-die routing coupled in a composite passive channel to a second-die, second passive routing.

4. The multi-chip package of claim 1, further including:
   a first-die, second input-output circuitry on the first die;
   a first-die, second on-die routing in contact with the first-die, second input-output circuitry and in contact with a first-die, second electrical contact;
   a bridge-die, second passive routing on the bridge die that is in contact with the first-die, second electrical contact;
   wherein the bridge-die, second passive routing is coupled to the second die at a second-die, second electrical contact;
   a second-die, second on-die routing coupled in a composite passive channel to a second-die, second passive routing; and
   wherein the second-die, second on-die routing contacts a second-die second input-output circuitry.

5. The multi-chip package of claim 1, wherein the first die includes a first core-logic region and a second core-logic region, further including:
   a first-die, second on-die routing in contact with a first-die, second input-output circuitry that is part of the second core-logic region;
   a first-die, second on-die routing in contact with the first-die, second input-output circuitry and in contact with a first-die, second electrical contact, wherein the bridge die is in contact with the first-die, second electrical contact;
   a bridge-die, second passive routing in contact with the first-die, second electrical contact;
   a second-die, second electrical contact that is on the bridge die and in contact with the bridge-die, second passive routing;
   a second-die, second on-die routing in contact with the second-die, second electrical contact; and
   a second-die, second input-output circuitry in contact with the second-die, second on-die routing.

6. The multi-chip package of claim 1, wherein the second die includes a first core-logic region and a second core-logic region, further including:
   a first-die, second on-die routing in contact with a first-die, second input-output circuitry;
   a first-die, second on-die routing in contact with the first-die, second input-output circuitry and in contact with a first-die, second electrical contact, wherein the bridge die is in contact with the first-die, second electrical contact;
   a bridge-die, second passive routing in contact with the first-die, second electrical contact;
   a second-die, second electrical contact that is on the bridge die and in contact with the bridge-die, second passive routing;
   a second-die, second on-die routing in contact with the second-die, second electrical contact; and
   a second-die, second input-output circuitry in contact with the second-die, second on-die routing, and wherein the second-die, second input-output circuitry is part of the second core-logic region.

7. The multi-chip package of claim 1, further including:
   a third die coupled to the bridge die by a passive signal channel, wherein the third die contacts a first-die third contact on the first die.

8. The multi-chip package of claim 1, further including:
   a first-die, second on-die routing that contacts a first-die, second electrical contact;
   a bridge-die, second passive routing on the bridge die that is in contact with the first-die, second electrical contact; and
   wherein the bridge-die, second passive routing is coupled to the second die at a bridge-die contact.

9. The multi-chip package of claim 1, further including:
   a first-die, second on-die routing that contacts a first-die, second electrical contact;
   a bridge-die, second passive routing on the bridge die that is in contact with the first-die, second electrical contact;
   wherein the bridge-die, second passive routing is coupled to the second die at a second-die contact; and
   wherein the bridge-die, second passive routing is in a metallization strata vertically adjacent the bridge-die, first passive routing, and wherein the metallization strata includes at least two different cross-section sizes, including a first small size and a second medium size.

10. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact; and
wherein the bridge-die, second passive routing is in a metallization strata vertically adjacent the bridge-die, first passive routing, and wherein the metallization strata includes at least two different cross-section sizes, including a first small size, a second medium size, and a third giant size.

11. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata vertically adjacent the bridge-die, first passive routing; and
an adjacent first die adjacent the first die, wherein a converged mesh-stop (CMS) region in the adjacent first die is coupled to the first-die, first on-die routing.

12. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata vertically adjacent the bridge-die, first passive routing;
an adjacent first die adjacent the first die, wherein a converged mesh-stop (CMS) region in the adjacent first die is coupled to the first-die, first on-die routing; and
an adjacent second die adjacent the second die, wherein a converged mesh-stop (CMS) region in the adjacent second die is coupled to the second-die, first on-die routing.

13. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata vertically adjacent the bridge-die, first passive routing; and
an adjacent second die adjacent the second die, wherein a converged mesh-stop (CMS) region in the adjacent second die is coupled to the second-die, first on-die routing.

14. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact; and
wherein the bridge-die, second passive routing is in a metallization strata and laterally adjacent the bridge-die, first passive routing.

15. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata and laterally adjacent the bridge-die, first passive routing; and
an adjacent first die adjacent the first die, wherein a converged mesh-stop (CMS) region in the adjacent first die is coupled to the first-die, first on-die routing.

16. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata and laterally adjacent the bridge-die, first passive routing; and
an adjacent second die adjacent the second die, wherein a converged mesh-stop (CMS) region in the adjacent second die is coupled to the second-die, first on-die routing.

17. The multi-chip package of claim 1, further including:
a first-die, second on-die routing that contacts a first-die, second electrical contact;
a bridge-die, second passive routing on the bridge die that is in contact with the first-die, second electrical contact;
wherein the bridge-die, second passive routing is coupled to the second die at a second-die contact;
wherein the bridge-die, second passive routing is in a metallization strata and laterally adjacent the bridge-die, first passive routing;
an adjacent first die adjacent the first die, wherein a converged mesh-stop (CMS) region in the adjacent first die is coupled to the first-die, first on-die routing; and
an adjacent second die adjacent the second die, wherein a converged mesh-stop (CMS) region in the adjacent second die is coupled to the second-die, first on-die routing.

18. A multi-chip package comprising:
a first die with signal routing, including:
a converged mesh-stop (CMS) region adjacent a core logic region;
first on-die input-output (I/O) circuitry adjacent the CMS region and spaced apart from a modular die-fabric interconnect (MDFI);
first-die, first on-die passive routing between the first on-die I/O circuitry and a first electrical contact that contacts a bride die, wherein the first electrical contact is closest to a first edge of the bridge die;
bridge-die passive routing on the bridge die between the first electrical contact and a second electrical contact on the bridge die, wherein the second electrical contact is closest to a second edge of the bridge die; and
a second die that contacts the second electrical contact.

19. The multi-chip package of claim 18, wherein the second die includes a second-die, first on-die passive routing between the second electrical contact and a second-die, first on-die I/O circuitry.

20. The multi-chip package of claim 18, wherein the second die includes a second-die, first on-die passive routing between the second electrical contact and a second-die, first on-die I/O circuitry, further including:
- a third die contacting the bridge die, wherein the third die is coupled to the first die by a composite passive signal channel.

21. The multi-chip package of claim 18, wherein the second die includes a second-die, first on-die passive routing between the second electrical contact and a second-die, first on-die I/O circuitry, further including:
- a first adjacent die adjacent the first die, wherein the first adjacent die includes a passive signal channel that contacts the first die; and
- a second adjacent die adjacent the second die, wherein the second adjacent die includes a passive signal channel that contacts the second die.

* * * * *